(12) United States Patent
Scheuerer et al.

(10) Patent No.: US 6,300,566 B1
(45) Date of Patent: Oct. 9, 2001

(54) ELECTRICAL CONNECTION OF A CIRCUIT CARRIER TO A CONDUCTOR-TRACK CARRIER

(75) Inventors: Ulf Scheuerer; Frank Franzen; Christian Fritzsche, all of Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/412,074

(22) Filed: Oct. 4, 1999

Related U.S. Application Data

(63) Continuation of application No. PCT/DE98/00770, filed on Mar. 13, 1998.

(51) Int. Cl.[7] .................................................. H05K 5/06
(52) U.S. Cl. ...................... 174/52.3; 174/59; 174/50.51; 174/50.52
(58) Field of Search .................... 174/52.3, 59, 50.52, 174/50.51; 257/704, 713, 693, 695

(56) References Cited

U.S. PATENT DOCUMENTS

| | | | |
|---|---|---|---|
| 5,223,855 | 6/1993 | Ota et al. | 347/209 |
| 5,280,413 * | 1/1994 | Pai | 361/792 |

FOREIGN PATENT DOCUMENTS

| | | |
|---|---|---|
| 2536361A1 | 2/1976 | (DE) . |
| 3315655A1 | 11/1983 | (DE) . |
| 3813565A1 | 11/1989 | (DE) . |
| 4737632A1 | 11/1994 | (DE) . |
| 0375271A2 | 6/1990 | (EP) . |
| 0491401A1 | 6/1992 | (EP) . |
| 2248450A | 4/1992 | (GB) . |
| 92/10011 | 6/1992 | (WO) . |

* cited by examiner

*Primary Examiner*—Dean A. Reichard
*Assistant Examiner*—Hung V Ngo
(74) *Attorney, Agent, or Firm*—Herbert L. Lerner; Laurence A. Greenberg; Werner H. Stemer

(57) ABSTRACT

An electrical connection configuration connects a circuit carrier to conductor tracks of a conductor-track carrier. Both the circuit carrier and the conductor-track carrier are carried by a base plate. The circuit carrier and the conductor-track carrier have a region in which they overlap and in which they are connected by an electrically conductive adhesive.

4 Claims, 2 Drawing Sheets

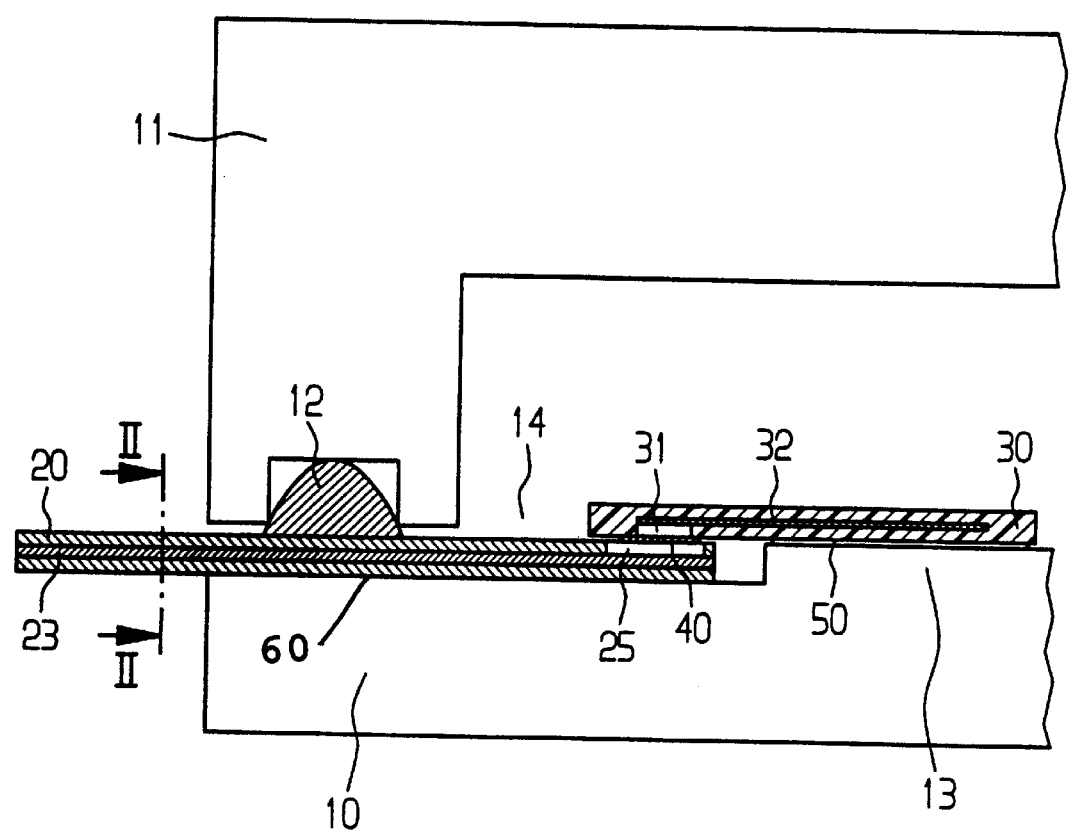

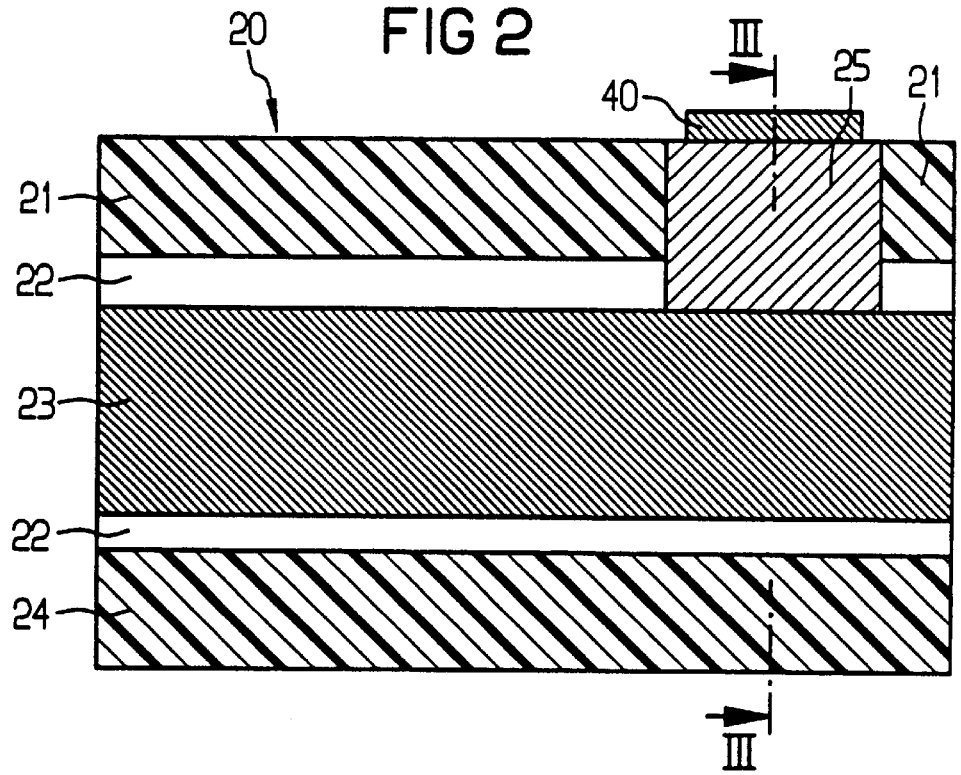
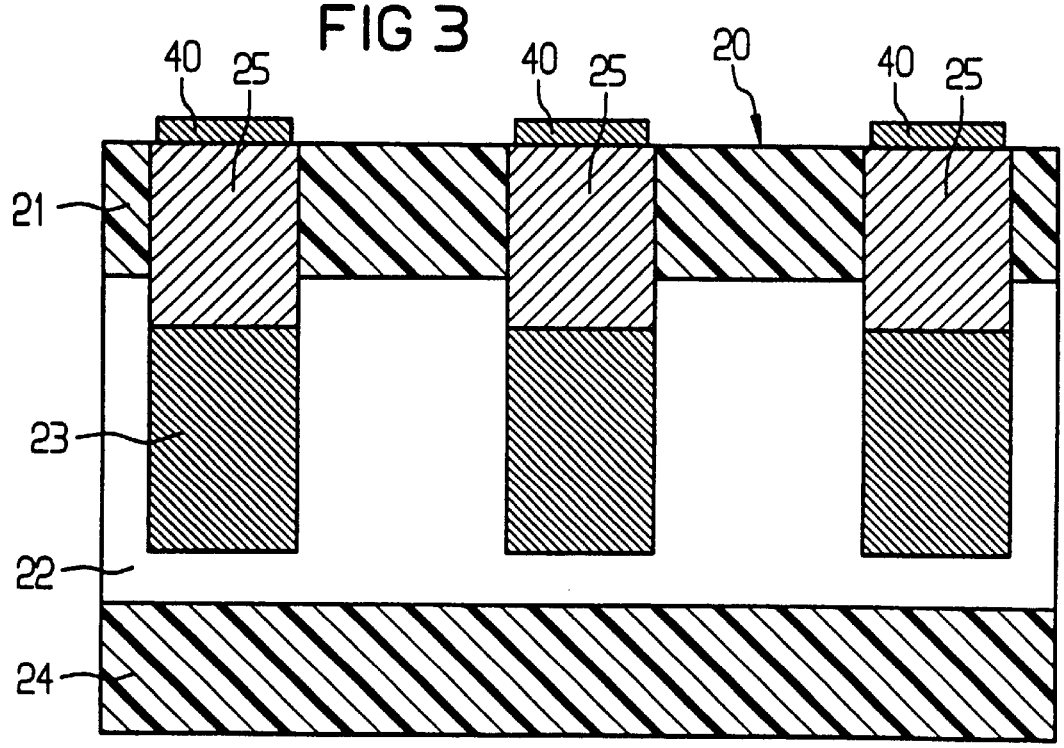

ELECTRICAL CONNECTION OF A CIRCUIT CARRIER TO A CONDUCTOR-TRACK CARRIER

CROSS-REFERENCE TO RELATED APPLICATION

This application is a continuation of copending International Application PCT/DE98/00770, filed Mar. 13, 1998, which designated the United States.

BACKGROUND OF THE INVENTION

FIELD OF THE INVENTION

The invention relates to an electrical connection configuration for connecting a circuit carrier to conductor tracks of a conductor-track carrier, and also to a method for producing an electrical connection of this type.

In motor vehicle electronics, in particular, it is often necessary to connect control electronics to a conductor. In motor vehicle drives, in particular, there is an increasing need to integrate control electronics in the engine or in the transmission. For this purpose, the control circuit fitted on a circuit carrier frequently has to be shielded from the oils that are used in engines and transmissions and contain additives that are extremely chemically aggressive. At the same time, however, electrical conductors have to be guided through a shield in order that components of the engine or of the transmission can be controlled electronically.

A connection configuration which is configured for conditions of this type is disclosed in European Patent EP 0 375 271 B1. An electronic unit disposed in a housing is connected via wires to a printed circuit board which establishes an electrical connection through a housing wall. Two different work processes are necessary for placing the electronic unit in the housing and establishing an electrical connection to the printed circuit board using wires. Establishing the electrical connection between the printed circuit board and the electronic unit is laborious in a housing.

U.S. Pat. No. 5,223,855 discloses a heat-generating head for a printer that has a circuit carrier and a conductor-track carrier that are electrically connected to one another. The circuit carrier and the conductor-track carrier are connected by soldering in an overlap region. Since the conductor-track carrier is disposed on the circuit carrier in the overlap region, different process steps are necessary for the fastening of the circuit carrier and the contact-making thereof with the conductor-track carrier. Published, British Patent Application GB 2 248 450 A describes an anisotropic, electrically conductive adhesive which is suitable for obtaining an electrical connection.

SUMMARY OF THE INVENTION

It is accordingly an object of the invention to provide an electrical connection of a circuit carrier to a conductor-track carrier which overcomes the above-mentioned disadvantages of the prior art methods and devices of this general type, in which a simple electrical connection between a circuit carrier and conductor tracks of a conductor-track carrier are provided.

With the foregoing and other objects in view there is provided, in accordance with the invention, an electrical connection configuration, including a circuit carrier; a base plate having an elevation covered exclusively by the circuit carrier; a conductor-track carrier having conductor tracks disposed on the base plate; an electrically conductive adhesive disposed on the conductor-track carrier, and the circuit carrier overlapping the conductor-track carrier in an overlap region between the circuit carrier and the conductor-track carrier. In the overlap region the conductor-track carrier is disposed on the base plate and the circuit carrier is disposed on the conductor-track carrier. The circuit carrier is electrically connected to the conductor-track carrier by the electrically conductive adhesive in the overlap region, and the circuit carrier is bonded onto the conductor-track carrier exclusively in a region outside of the elevation.

In accordance with an added feature of the invention, there is an electrically insulating and thermally conductive adhesive bonding the circuit carrier on the base plate.

In accordance with another feature of the invention, the conductor-track carrier is a flexible sheet.

In accordance with an additional feature of the invention, there is a housing part disposed on the base plate and the housing part has a cavity formed therein in a region where the housing part meets the base plate. The circuit carrier is disposed in the cavity, and the conductor-track carrier is guided through between the base plate and the housing part into the cavity.

In accordance with a further added feature of the Invention, there is a liquid-resistant adhesive bonding the conductor-track carrier onto the base plate; and a sealing element sealing the conductor-track carrier with respect to the housing part with a result that no liquid can penetrate into the cavity.

With the foregoing and other objects in view there is further provided, in accordance with the invention, a method for electrically connecting a circuit carrier to conductor tracks of a conductor-track carrier, which includes providing a base plate having an elevation; fixing the conductor-track carrier adjacent to the elevation on the base plate with a result that the conductor-track carrier and the elevation form substantially one plane; disposing on a side remote from the base plate an electrically conductive adhesive on the conductor-track carrier in a region free from an insulating cover opposite a conductor track of the conductor-track carrier; and disposing the circuit carrier directly on the base plate and bonding the circuit carrier onto the conductor-track carrier in an overlap region between the circuit carrier and the conductor-track carrier with a result that an electrical connection is produced between at least one of the conductor tracks of the conductor-track carrier and a contact point of the circuit carrier and, at a same time, the circuit carrier being mechanically fixed.

In accordance with an added feature of the invention, there are the steps of placing a housing part having a cavity formed therein on the base plate; disposing the circuit carrier in the cavity; and guiding the conductor-track carrier between the base plate and the housing part into the cavity.

It is preferable for the circuit carrier to be fixed together with the control electronics simultaneously in the housing and to be electrically contact-connected to leads of the conductor-track carrier.

Other features which are considered as characteristic for the invention are set forth in the appended claims.

Although the invention is illustrated and described herein as embodied in an electrical connection of a circuit carrier to a conductor-track carrier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, fragmented, sectional view of a circuit carrier which is bonded onto a conductor-track carrier that has been guided through a housing wall according to the invention;

FIG. 2 is a sectional view through the conductor-track carrier in a direction of a bushing through the housing wall; and FIG. 3 is a sectional view through the conductor-track carrier perpendicularly to the direction of the bushing.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown one half of a rotationally symmetrical body. A conductor-track carrier 20 is guided through a housing wall 11. More precisely, the conductor-track carrier 20 is guided into a cavity 14 between a metallic base plate 10 and a housing part configured as a housing wall 11. The conductor-track carrier 20 is bonded onto the base plate 10, which is composed of aluminum, using an oil-resistant adhesive 60. The housing wall 11 is part of a housing cover. The housing contains merely the housing cover and the base plate 10 and also an optional, peripheral, oil-resistant sealing ring 12. The latter is pressed or vulcanized onto the conductor-track carrier 20 and seals the conductor-track 20 from the housing wall 11. However, the housing may also contain a plurality of parts or parts that are made differently. Furthermore, the base plate 10 need not necessarily be configured in one piece.

In a cavity 14 produced by the housing cover, the base plate 10 has an elevation 13 relative to a plane on which the conductor-track 20 is fitted. The height of the elevation 13 corresponds to a thickness of the conductor-track carrier 20. In this way, there is no height difference between a surface of the conductor-track carrier 20 that is remote from the base plate 10 and the elevation 13.

A circuit carrier 30 with control electronics is bonded onto the conductor-track carrier 20 in an edge section using a contact adhesive 40, and for the rest is bonded onto the elevation 13 of the base plate 10 using an electrically insulating thermally conductive adhesive 50. The circuit carrier 30 is a ceramic substrate (LTCC) with the control electronics, conductor tracks 32 and electrical contact points 31 opposite the conductor-track carrier 20. The contact points 31 are printed-on AgPd pads. The metallic base plate 10 serves both as a housing part and as a heat sink for the control electronics.

The fact that the conductor-track carrier 20 is bonded on around the elevation 13 of the base plate 10 or in a depression facilitates a mechanical fixing of the circuit carrier 30 to the base plate 10 and the simultaneous contact-making to the conductor tracks 23 of the conductor-track carrier 20. The circuit carrier 30 is mechanically fixed to the base plate 10 by the thermally conductive adhesive 50 resulting in good heat transfer between the circuit carrier 30 and the base plate 10 serving as a heat sink. The contact points 31 of the circuit carrier 30 are contact-connected to contact pads 25 of the conductor-track carrier 20 by the electrically conductive contact adhesive 40.

The same applies when the conductor-track carrier 20 is bonded onto an elevation, that is to say the circuit carrier 30 is fitted such that it is recessed relative to the conductor-track carrier 20 in accordance with its thickness. However, in this case the fixing of the circuit carrier 30 cannot be effected at the same time as the electrical contact-making.

Since the electrical connection between the circuit carrier 30 and the conductor-track carrier 20 are not established by bonding or soldering on wires, the space requirement on the circuit carrier 30 is minimized.

FIG. 2 illustrates the structure of the conductor-track carrier 20. It shows a section through the plane II—II of FIG. 1. The conductor-track carrier 20 is a flexible conductor-track sheet made of polyimide with a base sheet 24 and a covering sheet 21. The conductor tracks 23 are embedded in an adhesive layer 22 between the covering sheet 21 and the base sheet 24. A contact region with the circuit carrier 30 is free from the covering sheet 21, with the result that the conductor tracks 23 are not covered in an electrically insulating manner there. The contact pad 25 is guided through the adhesive layer 22 and the covering sheet 21. Over it there is applied a silver conductive adhesive as the electrically conductive contact adhesive 40, in order to enable electrical contact-making with the contact points 31 of the circuit carrier 30.

FIG. 3 shows a section view through the plane III—III of FIG. 2. It can be seen that interspaces between individual conductor tracks 23 are likewise filled by the adhesive layer 22.

We claim:

1. An electrical connection configuration, comprising:
    a circuit carrier;
    a base plate having an elevation covered exclusively by said circuit carrier;
    a conductor-track carrier having conductor tracks disposed on said base plate;
    an electrically conductive adhesive disposed on said conductor-track carrier; and
    said circuit carrier overlapping said conductor-track carrier in an overlap region between said circuit carrier and said conductor-track carrier;
    in said overlap region said conductor-track carrier disposed on said base plate and said circuit carrier disposed on said conductor-track carrier;
    said circuit carrier electrically connected to said conductor-track carrier by said electrically conductive adhesive in said overlap region;
    said circuit carrier bonded onto said conductor-track carrier exclusively in a region outside of said elevation;
    a housing part disposed on said base plate;
    said housing part having a cavity formed therein in a region where said housing part meets said base plate;
    said circuit carrier disposed in said cavity;
    said conductor-track carrier guided through between said base plate and said housing part into said cavity;
    a liquid-resistant adhesive bonding said conductor-track carrier onto said base plate; and
    a sealing element sealing said conductor-track carrier with respect to said housing part with a result that no liquid can penetrate into said cavity.

2. The electrical connection configuration according to claim 1, including an electrically insulating and thermally conductive adhesive bonding said circuit carrier on said base plate.

3. The electrical connection configuration according to claim 1, wherein said conductor-track carrier is a flexible sheet.

4. A method for electrically connecting a circuit carrier to conductor tracks of a conductor-track carrier, which comprises:

providing a base plate having an elevation;

bonding a conductor-track carrier onto the base plate with a liquid-resistant adhesive adjacent to the elevation on the base plate with a result that the conductor-track carrier and the elevation form substantially one plane;

disposing on a side remote from the base plate an electrically conductive adhesive on the conductor-track carrier in a region free from an insulating cover opposite a conductor track of the conductor-track carrier;

disposing a circuit carrier directly on the base plate and bonding the circuit carrier onto the conductor-track carrier in an overlap region between the circuit carrier and the conductor-track carrier with a result that an electrical connection is produced between at least one of the conductor tracks of the conductor-track carrier and a contact point of the circuit carrier and, at a same time, the circuit carrier being mechanically fixed;

placing a housing part having a cavity formed therein on the base plate to position the circuit carrier in the cavity and to have the conductor-track carrier be guided between the base plate and the housing part into the cavity; and sealing the conductor-track carrier with respect to the housing part with a sealing element with a result that no liquid can penetrate into the cavity.

* * * * *